(12) United States Patent
Ibrir

(10) Patent No.: US 12,199,580 B2
(45) Date of Patent: Jan. 14, 2025

(54) ANALOG IMPLEMENTATION OF VARIABLE-GAIN DIFFERENTIATORS BASED ON VOLTAGE-CONTROLLED AMPLIFIERS

(71) Applicant: KING FAHD UNIVERSITY OF PETROLEUM AND MINERALS, Dhahran (SA)

(72) Inventor: Salim Ibrir, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 604 days.

(21) Appl. No.: 17/585,655

(22) Filed: Jan. 27, 2022

(65) Prior Publication Data

US 2023/0238931 A1 Jul. 27, 2023

(51) Int. Cl.
*H03F 3/45* (2006.01)
*H03G 1/00* (2006.01)
*H03G 3/00* (2006.01)
*H03G 3/30* (2006.01)

(52) U.S. Cl.
CPC ......... *H03G 3/004* (2013.01); *H03F 3/45475* (2013.01); *H03G 1/0088* (2013.01); *H03G 3/30* (2013.01)

(58) Field of Classification Search
CPC ........ H03G 3/004; H03G 1/0088; H03G 3/30; H03F 3/45475; H03F 2203/45051; H03F 2203/45114; H03F 2203/45138; H03F 2203/45174; G06G 7/18

USPC .................................................. 330/252–261
See application file for complete search history.

(56) References Cited

U.S. PATENT DOCUMENTS

| | | | |
|---|---|---|---|
| 4,138,728 A | 2/1979 | Tung | |
| 8,749,218 B2 * | 6/2014 | Mateu | H02M 3/156 323/284 |
| 10,763,887 B2 * | 9/2020 | Albinet | H03M 3/342 |
| 2013/0106487 A1 | 5/2013 | Gupta | |

FOREIGN PATENT DOCUMENTS

| | | |
|---|---|---|
| JP | 61-21504 | 1/1986 |
| JP | 2012-65266 | 3/2012 |

* cited by examiner

*Primary Examiner* — Hieu P Nguyen
(74) *Attorney, Agent, or Firm* — Oblon, McClelland, Maier & Neustadt, L.L.P.

(57) ABSTRACT

Disclosed are systems and methods for a variable-gain differentiator in series with at least two non-inverting amplifiers. The variable-gain differentiator is connected to a voltage-controlled source at its non-inverting input and to its output at its inverting input. The output is connected to the non-inverting input of the first non-inverting amplifier. The output of the first non-inverting amplifier is connected to the input of the second non-inverting amplifier. The output of the second non-inverting amplifier is connected to a series of three integrators. Each integrator is connected to its output by a feedback path. Varying the gain of the voltage-controlled amplifier varies the gain of the differentiator at the output of the third integrator, thereby varying the output of the system.

20 Claims, 9 Drawing Sheets

ANALOG IMPLEMENTATION OF VARIABLE-GAIN DIFFERENTIATORS BASED ON VOLTAGE-CONTROLLED AMPLIFIERS

BACKGROUND

Technical Field

The present disclosure is directed to differentiators and, more specifically, to voltage-controlled operational amplifiers configured to produce analog, variable-gain differentiators.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In both analog and digital circuits, numerous practical applications involve signal differentiation as an operation without any knowledge of the explicit signal form or the underlying model that generates such a signal. Peak signal detection, estimation of speed and/or acceleration of moving objects, derivative spectroscopy, health monitoring, trace analysis, and control system designs are non-exhaustive examples of applications in which differentiation of a signal is needed to realize various objectives. However, differentiating a signal from given samples is a difficult task with recognized challenges. One difficulty presented to engineers in designing practical, real-world applications is the high sensitivity of differentiators to any additive noise that may be associated with input signals.

A variety of solutions have been proposed for tracking time-derivative signals, but differentiation systems are roughly categorized into two primary classifications: discrete-time and continuous-time differentiation systems. The first class describes systems generally operating on the principle of finite-difference rules. Calculating a derivative of a signal is based on a Taylor expansion of the signal around a specified point. The second class of systems includes all types of continuous-time differentiators, regardless of approach in implementing the operation.

Among implementations for differentiators, Japanese Patent 2012065266A describes a variable-gain integrator having a variable-gain differentiator. In this reference, an open-loop gain is a variable. The differentiator includes a series of integrators with feedback from each respective output to a respective inverting input of the same integrator. However, the disclosed circuits lack a configuration capable of improving sensitivity of differentiators to additive noise introduced with an input.

U.S. Pat. No. 8,779,832 describes a bi-quad circuit which includes integrators, attenuators and summers. Variable gain attenuators feed signals forward and backward from the input and output of each of two. Once again, the disclosed circuits in the reference lack a configuration capable of improving sensitivity of differentiators to any noise added to inputs of the system.

Accordingly, it is one object of the present disclosure to provide methods and systems for implementing analog circuits that provide an estimate of the first derivative of a given signal in a flexible, dynamic manner. In achieving these objectives, the disclosed circuits can decrease the sensitivity of differentiators to additive noise that may be introduced with input signals.

SUMMARY

In an exemplary embodiment, a variable gain differentiator includes a voltage generator, a first voltage divider, a non-inverting operational amplifier, a first comparator block, a direct current (DC) voltage-controlled variable-gain amplifier, a non-inverting difference amplifier block, an integrator block, a first intermediate difference amplifier, and a second comparator block. The voltage generator can be configured to generate an alternating current input signal, u. The first voltage divider is connected to the voltage generator. The non-inverting operational amplifier includes a non-inverting operational amplifier input and a non-inverting operational amplifier output. The non-inverting operational amplifier input is connected to the first voltage divider. The first comparator block includes a first non-inverting comparator block input and a first comparator block output. The first non-inverting comparator block input is connected in series with the non-inverting operational amplifier output. The DC voltage-controlled variable-gain amplifier ($V_C$), which generates a gain parameterized by a variable gamma ($\gamma$), is connected to a power input of the first comparator block. The non-inverting difference amplifier block includes a non-inverting difference amplifier block input and a non-inverting difference amplifier block output. The non-inverting difference amplifier block input is connected in series with the first comparator block output. The integrator block, which has a plurality of integrator block outputs, is connected in series with the non-inverting difference amplifier block output. The first intermediate difference amplifier, which also has a first intermediate difference amplifier output, is connected in series with one of the integrator block outputs. The second comparator block can be connected in series with the first intermediate difference amplifier output, the second comparator block having a second comparator block output connected to the inverting input of the difference amplifier block. A second power supply input of the second comparator block can be connected to the DC voltage-controlled variable-gain amplifier. A last integrator block output of the plurality of integrator block outputs can be connected to an inverting input of the non-inverting operational amplifier.

The DC voltage-controlled variable-gain amplifier is configured to vary a gain of the first comparator block and the second comparator block. Varying the gain of the first comparator block and the second comparator block varies an output gain of the variable gain differentiator.

In another embodiment, the variable gain differentiator includes the above components, as well as a third comparator block and a third integrator. The DC voltage-controlled variable-gain amplifier is configured to vary a gain of the first, second, and third comparator blocks. Again, varying the gain of the comparator blocks varies an output gain of the variable gain differentiator.

In another exemplary embodiment, an $n^{th}$-order variable-gain differentiator includes a voltage generator configured to generate an alternating current input signal, u, a first voltage divider connected to the voltage generator and a non-inverting operational amplifier. The non-inverting operational amplifier has a non-inverting operational amplifier input connected to the first voltage divider and a non-inverting operational amplifier output. The $n^{th}$-order variable-gain differentiator also includes a first comparator block including n comparators connected in series (n is selected from the range of 1 to 20). A first non-inverting comparator input is connected in series with the non-inverting operational amplifier output and a first comparator block output is an output of the $n^{th}$ comparator. A DC voltage-controlled variable-gain amplifier ($V_C$) is connected to a power input each of the n comparators of the first comparator block. The DC voltage-controlled variable-gain amplifier generates a gain ($\gamma$). The $n^{th}$-order differentiator includes a non-inverting difference amplifier block having (n−1) non-inverting difference amplifiers. The non-inverting difference amplifier block includes a non-inverting difference amplifier block input connected in series with the first comparator block output and a non-inverting difference amplifier block output connected at the $(n-1)^{th}$ non-inverting difference amplifier. The differentiator further includes an integrator block connected in series with the non-inverting difference amplifier block output. The integrator block has n integrator block outputs. The first intermediate difference amplifier is connected in series with one of the n integrator block outputs. The first intermediate difference amplifier includes a first intermediate difference amplifier output. The $n^{th}$-order differentiator also includes a second comparator block connected in series with the first intermediate difference amplifier output. The second comparator block includes a second comparator block output connected to the inverting input of the difference amplifier block and a second power supply input connected to the DC voltage-controlled variable-gain amplifier. The $n^{th}$-order differentiator further includes an $n^{th}$ integrator block output of the plurality of integrator block outputs connected to an inverting input of the non-inverting operational amplifier, where the $n^{th}$ integrator block output is the output, y, of the $n^{th}$-order variable gain differentiator. The DC voltage-controlled variable-gain amplifier of the differentiator is configured to vary a gain of the first comparator block and the second comparator block. Varying the gain of the first comparator block and the second comparator block varies an output gain of the $n^{th}$-order variable-gain differentiator.

In another exemplary embodiment, a method for $n^{th}$-order, variable-gain differentiation includes generating an alternating current input signal, u. The alternating current input signal is transmitted to a non-inverting operational amplifier in series with n comparators. A comparator output is generated at the $n^{th}$ comparator. The comparator output is transmitted to an input of n series connected integrators. An integrator output signal is generated by each of the n series connected integrators. An $n^{th}$ integrator output signal is an $n^{th}$ derivative of the alternating current input signal (u). The DC voltage-controlled variable-gain amplifier generates a DC voltage signal having variable gain ($\gamma$). A gain of the comparator output at the $n^{th}$ comparator is equal to an $n^{th}$ power of the variable gain, $\gamma$. The DC voltage signal is provided to a $k^{th}$ power supply input of each of n integrators, where n is selected from the range of 1 to 20.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
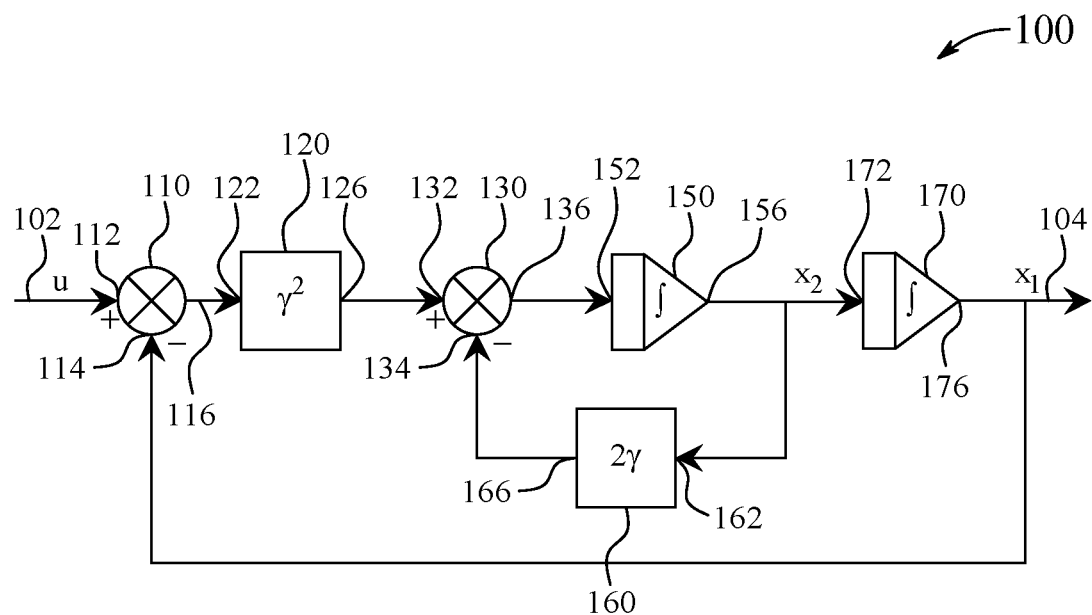
FIG. 1 is a state-space system diagram of a second-order differentiator, according to certain embodiments.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

One aspect of the present application is to realize analog circuits that provide an estimate of the first derivative of a given signal. Moreover, the differentiation function is coupled with an ability to modify the circuit's behavior via a controlled voltage. Accordingly, a voltage-controlled amplifier is used to tune the gain of the amplifier. This enables increased precision for the differentiator, as well as improves the system's ability to prevent additive noise from corrupting subsequent measurements.

Disclosed are systems, devices and methods for a variable-gain differentiator using a series of at least two non-inverting amplifiers, although this number can vary. The number of non-inverting amplifiers determines the order of the variable-gain differentiator. The number is denoted as n or as an $n^{th}$-order differentiator throughout the above and below description (and in some embodiments ranges anywhere from two to 20).

The variable-gain differentiator is connected to a voltage-controlled source and a first non-inverting amplifier. The first non-inverting amplifier is connected to a second non-inverting amplifier, which is in turn connected to a first of a series of two integrators. Each integrator is connected to its output by a feedback path. The second integrator is also connected to the inverting input of the first integrator. In embodiments having a third non-inverting amplifier, a third integrator output is connected to the inverting input of the variable gain differentiator. The feedback paths may include various configurations of inverters, capacitors, and/or resistors based on the desired characteristics of the system. Varying the bias voltage of the voltage-controlled amplifier varies the gain of the differentiator at the output of the n$^{th}$ integrator, which in some embodiments can be in a range from 40 dB to –40 dB.

Turning now to FIG. 1, a state-space system diagram of a second-order differentiator 100 (or simply "differentiator 100") is shown, according to certain embodiments. The differentiator 100 includes a system input 102, a system output 104, a first adder 110, a first comparator block 120, a second adder 130, a first integrator 150, a second comparator block 160 in a feedback path between the output 156 of the first integrator 150 and the second adder 130, and a second integrator 170.

The differentiator 100 is illustrated with the system input 102 shown as an input signal "u", which serves as the first adder input 112 to the first adder 110, according to certain embodiments. In the drawings, variables such as u(t), $x_1$(t), and $x_2$(t) are shown without their time dependence, for simplicity. The first adder 110 includes the positive first adder input 112, as well as a negative first adder input 114 for receiving a feedback signal, $x_1$, and a first adder output 116. The first adder output 116 is connected to the first comparator block 120. An output from the second integrator 170 (denoted as a second integrator output 176, or output $x_1$, and described in greater detail below) is connected as feedback to the negative first adder input 114. The sum of the signals from the positive first adder input 112 and the negative first adder input 114 are output as the first adder output 116.

The first comparator block 120 has a first comparator input 122 and a first comparator output 126. The first adder output 116 is connected to the first comparator block 120 as the first comparator input 122. The first comparator block 120 performs a second-order operation on the first comparator input 122. The operation of the first comparator block 120 is an operation parameterized by γ. For example, the operation of the first comparator block 120 can be to scale the first comparator input 122 by a factor of $\gamma^2$. After the operation of the first comparator block 120 on the first comparator input 122, the first comparator output 126 is generated.

The second adder 130 includes a positive second adder input 132, a negative second adder input 134, and a second adder output 136. The first comparator output 126 is connected to the second adder 130 as the positive second adder input 132. An output from the second comparator block 160 (denoted as second comparator output 166 described in greater detail below) is connected as the negative second adder input 134. The sum of the signals from the positive second adder input 132 and the negative second adder input 134 are output as the second adder output 136.

The first integrator 150 has a first integrator input 152 and a first integrator output 156. The first integrator input 152 is received from the second adder 130 in the form of the second adder output 136. The first integrator output 156 is connected to two different components, the feedback path including the second comparator block 160 and the second integrator 170. The first integrator output 156 is an output signal denoted as "$x_2$" described in further mathematical detail below.

The first integrator output 156 is provided to the second comparator block 160. Thus, in a lossless system, the first integrator output 156 also serves as a second comparator input 162. This is described in terms of a lossless system, because any real-world implementation of differentiator 100 would include some small resistance in the transmission between components that creates differences in the signals (which may be negligible or not). The second comparator block 160 performs a first-order operation on the second comparator input 162. The operation of the second comparator block 160 is also an operation parameterized by γ. For example, the operation of the second comparator block 160 can be to scale the second comparator input 162 by a factor of 2γ. The second comparator block 160 has a second comparator output 166, which is provided to the second adder 130 as the negative second adder input 134 described above.

Because the first integrator output 156 is also connected to the second integrator 170, in a lossless system the first integrator output 156 is also the equivalent to a second integrator input 172. The second integrator 170 receives the second integrator input 172 and, like the first integrator 150, provides the resulting integrated signal, shown as a second integrator output 176, to two components of the differentiator 100. The second integrator output 176 is an output signal denoted as "$x_1$" described in further mathematical detail below. The second integrator output 176 is also the signal described above that is provided to the first adder 110 as the negative first adder input 114. Further, the second integrator output 176 is the output of the overall differentiator 100, described above as the system output 104, also denoted as an output signal y in the equations below, i.e., $y = x_2$.

If the second-order differentiator 100 shown in FIG. 1 is an analog system, then differentiator 100 is both a linear and a continuous-time system. Based on those properties, a set of equations can be constructed to note the state dynamics as well as the signal characteristics of the differentiator. Equations 1-4 below set out those dynamics and characteristics, with the first three equations characterizing the state variables (i.e., $x_1$ and $x_2$) and their derivatives $\dot{x}_1$ and $\dot{x}_2$ and input/output relationships (for input u and output y). The fourth equation sets out the comprehensive transfer function between input u and output y.

$$\dot{x}_1 = x_2 \qquad (\text{Eq. 1})$$

$$\dot{x}_2 = -\gamma^2(x_1 - u) - 2\gamma x_2 \qquad (\text{Eq. 2})$$

$$y = x_2 \qquad (\text{Eq. 3})$$

$$G(s) = \frac{s}{1 + \frac{2s}{\gamma} + \frac{1}{\gamma^2}s^2} \qquad (\text{Eq. 4})$$

where s is a complex number frequency parameter of a LaPlace transform.

As seen in these equations and relationships, specifically in Eq. 4, the transfer function of the differentiator 100 approaches a pure differentiator as the value of the gain or gamma gets very large (i.e., as γ approaches ∞). Thus, the practical realization of the ideal differentiator disclosed in FIG. 1 can be implemented based on tuning the parameter γ as the variable gain of the system.

Figure 2:
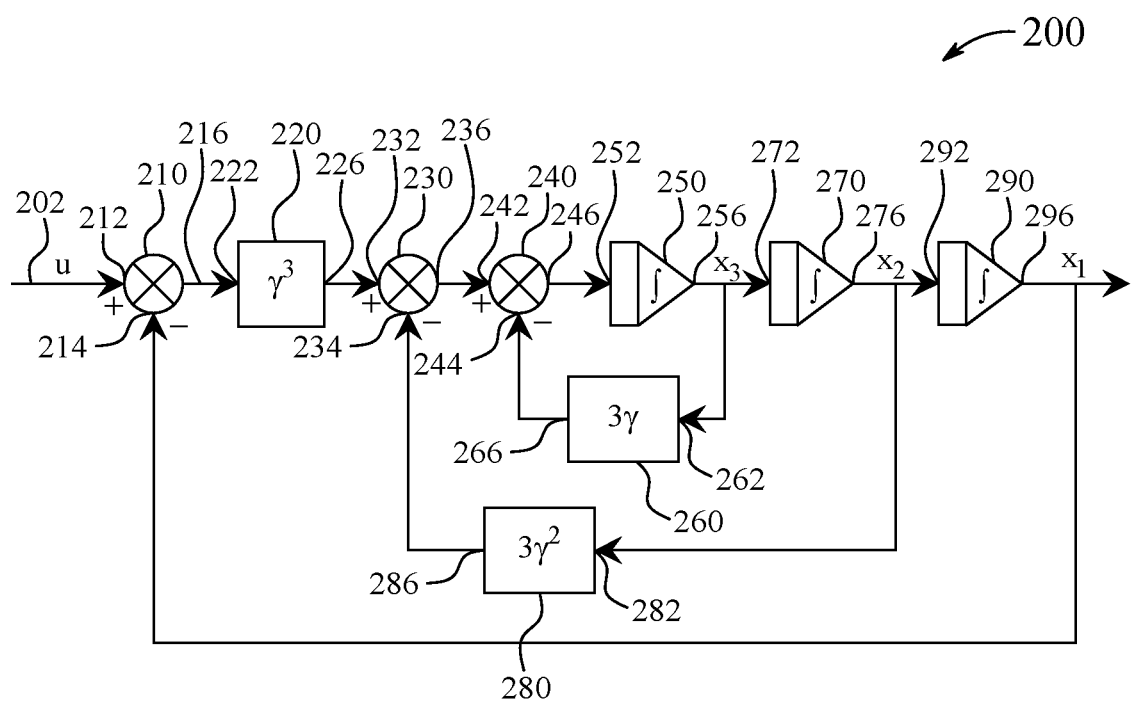
FIG. 2 is a state-space system diagram of a third-order differentiator, according to certain embodiments.

Referring now to FIG. 2, a state-space system diagram of a third-order differentiator 200 (or simply "differentiator 200") is shown, according to an embodiment. Where possible, like elements from FIG. 1 will be used to denote substantially similar or identical features and components. The differentiator 200 includes a system input 202, a system output 204, a first adder 210, a first comparator block 220, a second adder 230, a third adder 240, a first integrator 250, a second comparator block 260, a second integrator 270, a third comparator block 280, and a third integrator 290.

The differentiator 200 is also illustrated with the system input 202 shown as an input signal "u". The system input 202 serves as a positive first adder input 212 to the first adder 210. The first adder 210 has the positive first adder input 212, as well as a negative first adder input 214, and a first adder output 216. The first adder output 216 is connected to the first comparator block 220. An output from the third integrator 290 (denoted as a third integrator output 296, or output $x_1$, and described in further detail below) is connected as the negative first adder input 214. The sum of the signals from the positive first adder input 212 and the negative first adder input 214 are output as the first adder output 216.

The first comparator block 220 has a first comparator input 222 and a first comparator output 226. The first adder output 216 is connected to the first comparator block 220 as the first comparator input 222, in a lossless system. The first comparator block 220 performs a third-order operation on the first comparator input 222. The operation of the first comparator block 220 is an operation parameterized by $\gamma$. For example, the operation of the first comparator block 220 can be to scale the first comparator input 222 by a factor of $\gamma^3$. After the operation of the first comparator block 220 on the first comparator input 222, the first comparator output 226 is generated.

The second adder 230 includes a positive second adder input 232, a negative second adder input 234, and a second adder output 236. The first comparator output 224 is connected to the second adder 230 and in a lossless system is equivalent to the positive second adder input 232. An output from the third comparator block 280 (a third comparator output 286 described in greater detail below) is communicated as the negative second adder input 234. The sum of the signals from the positive second adder input 232 and the negative second adder input 234 are output as the second adder output 236.

The third adder 240 has a positive third adder input 242, a negative third adder input 244, and a third adder output 246 as shown in FIG. 2. The positive third adder input 242 is received from the second adder 230 in the form of the second adder output 236. Thus, in a lossless system, the signal supplied to the positive third adder input 242 is the equivalent of the second adder output 236. The negative third adder input 244 is received from the second comparator block 260 (a second comparator output 266 described in further detail below).

The first integrator 250 has a first integrator input 252 and a first integrator output 256. The first integrator input 252 is received from the third adder 240 in the form of the third adder output 246. The first integrator output 256, an output signal denoted as "$x_3$" described in further mathematical detail below, is communicated to two components of the differentiator 200, the second comparator block 160 and the second integrator 270.

Because the first integrator output 256 is provided to the second comparator block 260, the first integrator output 256 also serves as a second comparator input 262. The second comparator block 260 performs a first-order operation on the second comparator input 262. The first-order operation performed by the second comparator block 260 is also an operation parameterized by $\gamma$. For example, the operation of the second comparator block 260 can be to scale the second comparator input 262 by a factor of $3\gamma$. The second comparator block 260 has a second comparator output 266, which is provided to the third adder 240 as the negative third adder input 244 described above.

The first integrator output 256 is also transmitted to the second integrator 270. Accordingly, in a lossless system ignoring the effects of resistance during transmission, the first integrator output 256 is also the equivalent to a second integrator input 272. The second integrator 270 receives the second integrator input 272 and, like the first integrator 250, provides the resulting integrated signal, shown as a second integrator output 276, to two components of the differentiator 200. The second integrator output 276, a signal denoted as output $x_2$ described in further mathematical detail below, is an input for both the third comparator block 280 (shown as a third comparator block input 282) and the third integrator 290 (i.e., a third integrator input 292).

The third comparator block 280 performs a second-order operation. Consistent with the first comparator block 220 and the second comparator block 260, the third comparator block 280 performs an operation based on the parameter gamma ($\gamma$). The third comparator block 280 scales the third operation input 282 by three times the square of $\gamma$, i.e., $3\gamma^2$. This result is a third comparator output 286, which is provided to the second adder 230 as the negative second adder input 234.

As mentioned above, the second integrator output 276 is also the third integrator input 292 for the third integrator 290. After integrating the signal received, a third integrator output 296 is the signal described above provided to the first adder 210 as the negative first adder input 214. The third integrator output 294, an output signal denoted as "$x_1$" described in further detail mathematically below, is also the output of the overall differentiator 200, described above as the system output 204, and also denoted as an output y.

Because the system shown in FIG. 2 is also an analog system similar to the differentiator 100, the third-order differentiator 200 is both linear and a continuous-time system. A similar set of equations as outlined above with respect to the differentiator 100 can be constructed to note the state dynamics as well as the signal characteristics of the differentiator 200. Equations 5 to 7 below, when combined with previously disclosed Equations 1 and 3, set out those dynamics and characteristics. Equations 1 and 3 are still valid for the third-order differentiator 200, but Equations 5 and 6 characterize the state variables $x_2$ and $x_3$ and their derivatives $\dot{x}_2$ and $\dot{x}_3$ given the additional stage of operations. Equation 7 again sets out the comprehensive transfer function between input u and output y, but within the context of the new operations.

$$\dot{x}_2 = x_3 \tag{Eq. 5}$$

$$\dot{x}_3 = -\gamma^3(x_1 - u) - 3\gamma^2 x_2 - 3\gamma x_3 \tag{Eq. 6}$$

$$G(s) = \frac{s}{1 + \frac{3s}{\gamma} + \frac{3s^2}{\gamma^2} + \frac{s^3}{\gamma^3}} \tag{Eq. 7}$$

As seen in these equations and relationships, specifically in Eq. 7, the transfer function of the differentiator 200, similar to that of the differentiator 100, approaches a pure differentiator as the value of gamma gets very large (i.e., as $\gamma$ approaches $\infty$). Thus, tuning the parameter $\gamma$ as the variable gain of the system also provides a practical implementation of the ideal differentiator disclosed in FIG. 2.

The above equations can be generalized to any $n^{th}$-order differentiator by using the state-space model set out in Equations 9-13 shown below. According to these equations, u is again the input of the differentiator, while x is a state vector (where $\in \mathbb{R}^n$), and the state vector takes values according to the matrices set forth in Equations 11-13.

$$\dot{x} = A_\gamma x + B_\gamma u \quad \text{(Eq. 9)}$$

$$y = Cx \quad \text{(Eq. 10)}$$

$$A_\gamma = \begin{pmatrix} 0 & 1 & 0 & \cdots & 0 \\ 0 & 0 & 1 & \cdots & 0 \\ \vdots & \ddots & \ddots & \ddots & 0 \\ 0 & 0 & \cdots & 0 & 1 \\ -\gamma^n & -C_n^1 \gamma^{n-1} & \cdots & \cdots & C_n^{n-1}\gamma \end{pmatrix} \quad \text{(Eq. 11)}$$

$$B_\gamma = \begin{pmatrix} 0 \\ 0 \\ \vdots \\ 0 \\ \gamma^n \end{pmatrix} \quad \text{(Eq. 12)}$$

$$C_\gamma = (0 \; 1 \; 0 \; \cdots \; 0) \quad \text{(Eq. 13)}$$

From these relationships, the transfer function for an $n^{th}$-order differentiator can be generically described by Equation 14 set out below.

$$G(s) = C(sI - A_\gamma)^{-1}B_\gamma = \frac{s}{1 + \sum_{k=1}^{n} C_n^k \frac{s^k}{\gamma^k}} \quad \text{(Eq. 14)}$$

As shown above, Equation 14 demonstrates that for large values of $\gamma$, the output y represents the first derivative of the signal u. In practice, the values of $\gamma$ depend upon the maximum value that can reach the first derivative of the signal, which in turn varies depending on the specifications of the system. The present disclosure proposes a differentiator realized using a variable $\gamma$ that can be easily adjusted to meet the different specifications sought.

In the event that the input u is corrupted by some additive noise, the $n^{th}$-order differentiator can be modelled by the state-space dynamics shown below in Equation 15 and from Equation 10 as given previously. In this modeling, it is assumed $x \in \mathbb{R}^n$ is the state vector, u is the noise-free signal, and $\xi \in \mathbb{R}$ is a bounded-amplitude noise signal. The transfer function from the input $\xi$ to the output y is given by Equation 16 below.

$$\dot{x} = A_\gamma x + B_\gamma (u + \xi) \quad \text{(Eq. 15)}$$

$$G(s) = C(sI - A_\gamma)^{-1}B_\gamma = \frac{s}{1 + \sum_{k=1}^{n} C_n^k \frac{s^k}{\gamma^k}} = \frac{s}{\left(1 + \frac{s}{\gamma}\right)^n} \quad \text{(Eq. 16)}$$

$$\|G_{\xi,y}\|_\infty = \max_{\omega \in \mathbb{R}} \bar{\sigma}(G_{\xi,y}(j\omega)) = \max_{\xi \neq 0} \frac{\|y\|_{\mathcal{L}_2}}{\|\xi\|_{\mathcal{L}_2}} \quad \text{(Eq. 17)}$$

The norm $H_\infty$ of the transfer function $G_{\xi,y}(j\omega)$ is defined by Equation 17 as shown above, where $\bar{\sigma}$ stands for the largest singular value. The values of $\|G_{\xi,y}\|_\infty$ for different values of "n" are recorded in Table 1 shown below. As shown by the values in the table, the sensitivity of the transfer function to $\gamma$ decreases when the order of the differentiator n increases. The relationship can also be understood from the transfer function shown in Equation 16, where it is shown that the transfer function of order n can be represented as the product of the transfer function of order n−1 and a low pass filter $$\left(\text{i.e., the term } \frac{1}{1 + \frac{s}{\gamma}}\right).$$

Figure 5:
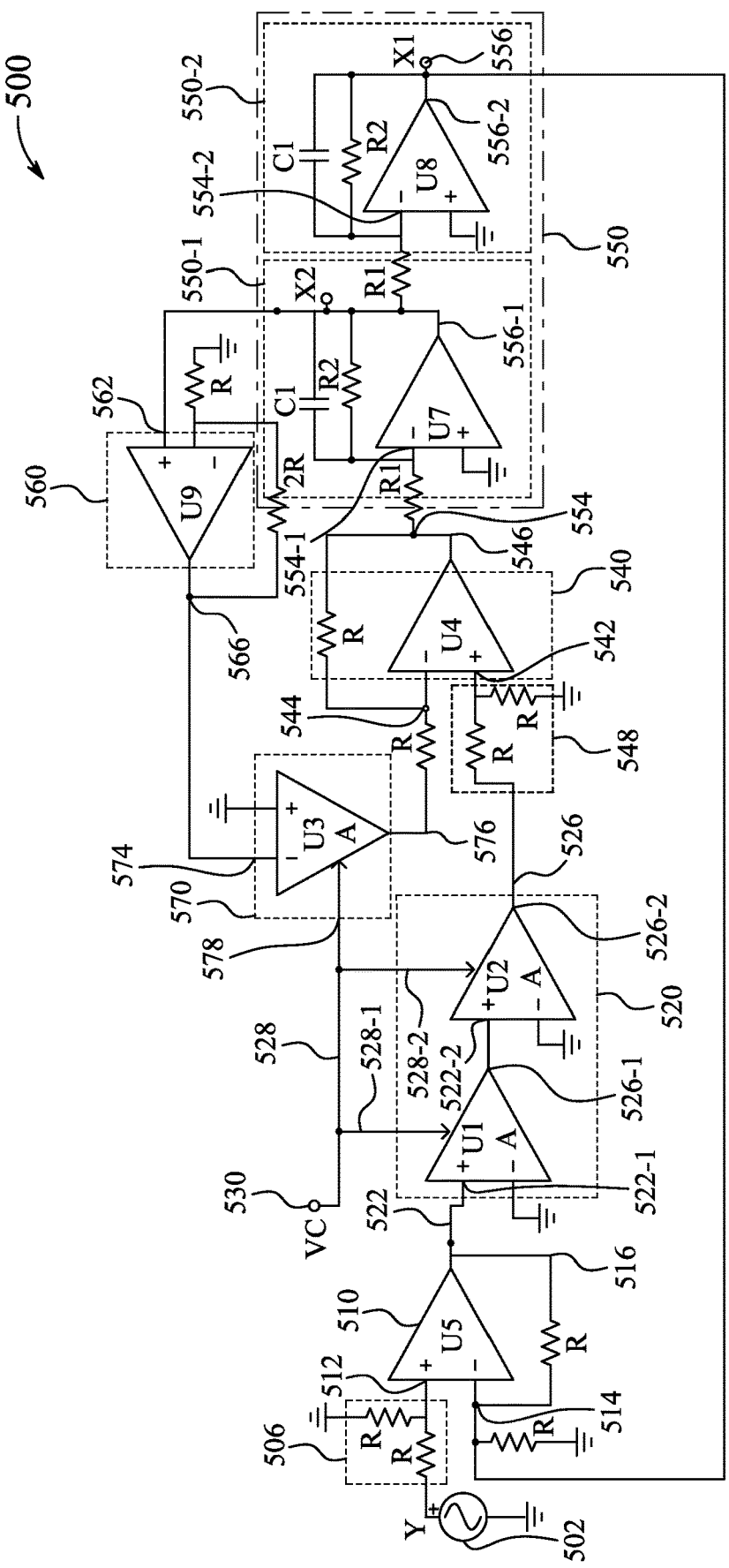
FIG. 5 is a circuit diagram of a second-order variable gain differentiator, according to certain embodiments.
Figure 7:
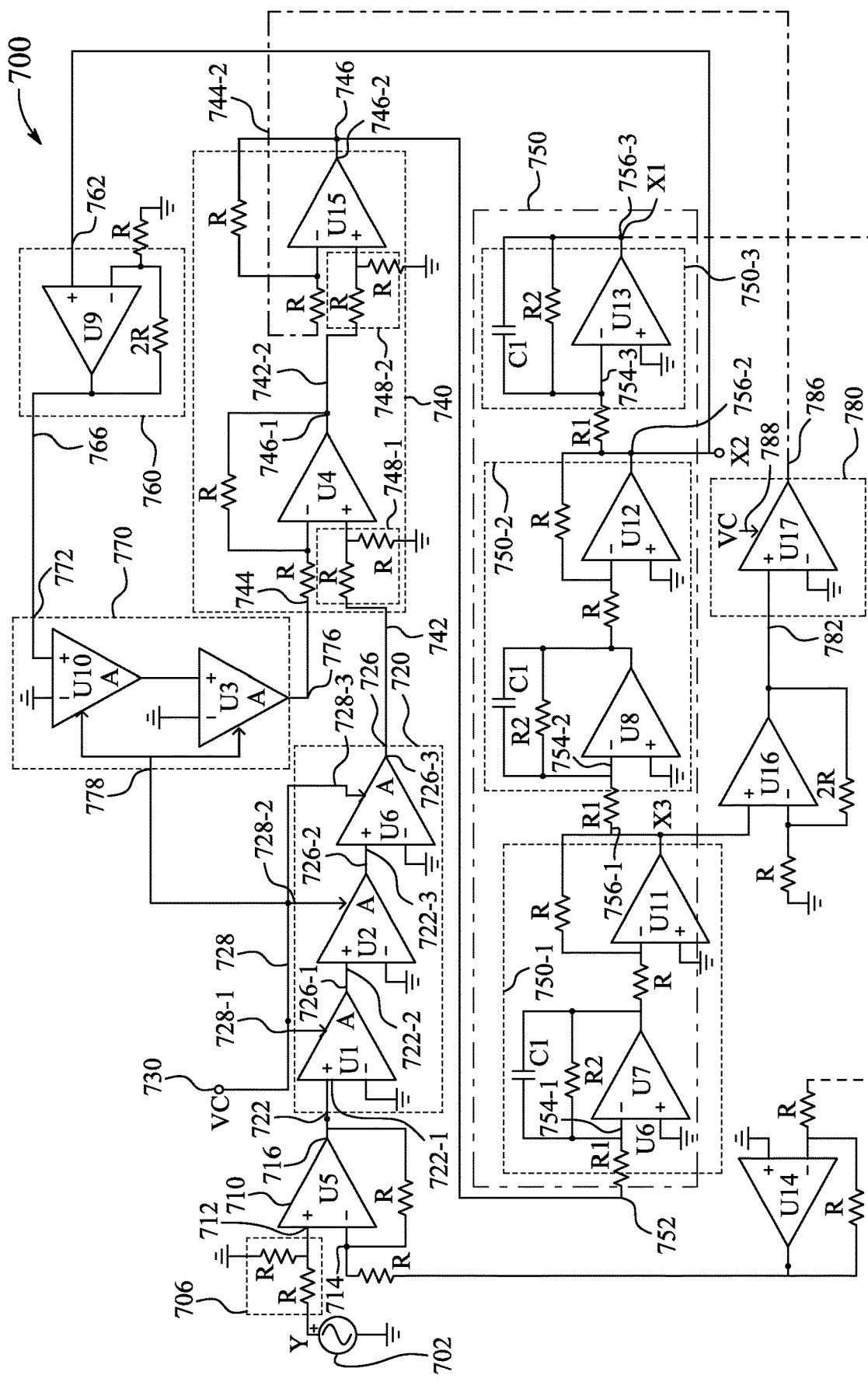
FIG. 7 is a circuit diagram of a third-order variable gain differentiator, according to certain embodiments.

While only two analog circuit embodiments are explicitly disclosed in the present application as seen in FIGS. 5 and 7 below, the concepts shown can be generalized for any arbitrary $n^{th}$-order differentiators. One example implementation is outlined with respect to FIG. 9 that follows.

TABLE 1

| n | $\|G_{\xi,y}\|_\infty$ |
|---|---|
| 2 | $\dfrac{\gamma}{2}$ |
| 3 | $\dfrac{2\sqrt{3}}{9}\gamma$ |
| 4 | $\dfrac{3\sqrt{3}}{16}\gamma$ |
| 5 | $\dfrac{16\sqrt{5}}{125}\gamma$ |
| 8 | $\dfrac{343\sqrt{7}}{4096}\gamma$ |
| 20 | $0.1373\gamma$ |

Figure 3:
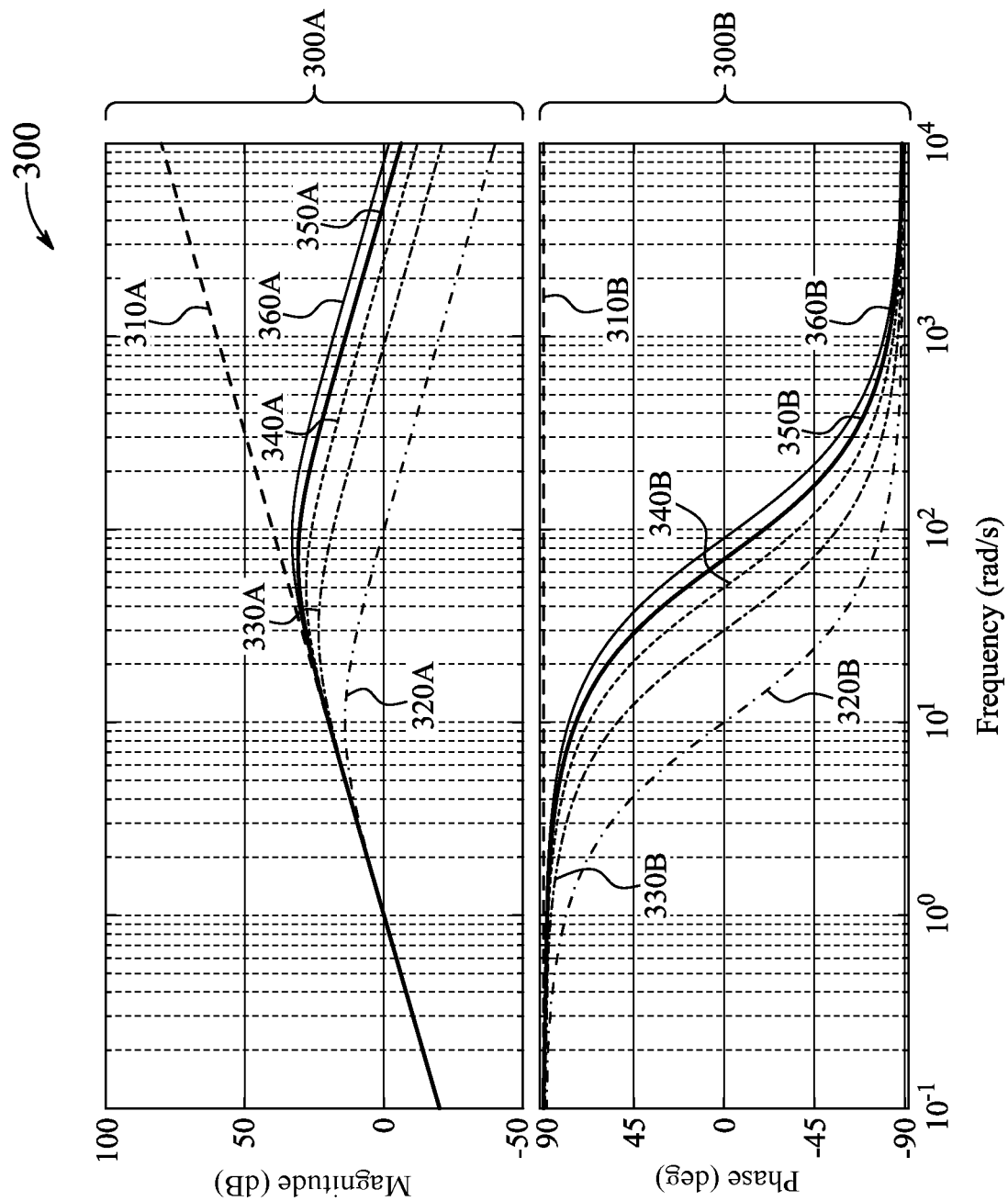
FIG. 3 is a Bode plot of magnitude and phase for specified values of gain ($\gamma$), according to certain embodiments.

FIG. 3 is a Bode plot graph 300 for specified values of gamma ($\gamma$), according to certain embodiments. The Bode plot graph 300 has a magnitude graph 300A shown at the top, comparing frequency (measured in radians per second) on the horizontal axis versus magnitude (measured in decibels) on the vertical axis. The Bode plot graph 300 also has a phase graph 300B shown at the bottom, comparing phase (in degrees) on the vertical axis against the same frequency scale along the horizontal axis.

The magnitude graph 300A includes an idealized differentiator plot 310A, showing the relationship between magnitude and frequency when an idealized differentiator is implemented as a theoretical baseline. The magnitude graph 300A shows values from $10^{-1}$ radians per second to $10^4$ radians per second on the frequency axis. As seen by the idealized differentiator plot 310A, the relationship is linear for magnitude (as both frequency and magnitude are represented logarithmically in the graph).

Also shown in the magnitude graph 300A are plots for gamma ($\gamma$) values equal to 10, 30, 50, 70, and 90, represented as plots 320A, 330A, 340A, 350A, and 360A, respectively. Each shows a linear relationship tracking with the idealized differentiator 310A for lower portions of the frequency range, before the magnitude value falls off as the frequency increases. For example, the $\gamma=10$ differentiator plot 320A starts to fall in magnitude between 1 and 10 radians per second, while the $\gamma=90$ differentiator plot 360A begins falling at a point closer to 100 radians per second. The plots in between those two extremes (i.e., the plots 330A, 340A, and 350A) agree with the idealized differentiator plot 310A for varying portions of the frequency range, with closer agreement correlated to an ascending gamma value (i.e., the higher the value of $\gamma$, the closer the relationship to ideal differentiator for a greater range of frequencies).

In parallel, the phase graph 300B includes a differentiator plot 310B, depicting the relationship between phase and frequency when an idealized differentiator is implemented as a theoretical baseline. The phase graph 300B shares an x (frequency) axis with the magnitude plot 300A, and thus also shows values from $10^{-1}$ radians per second to $10^4$ radians per second. As represented by the idealized differentiator plot 310B, the phase is constant for an idealized differentiator across all frequencies with a value of positive 90 degrees.

As seen with the magnitude graph 300A, the phase graph 300B also includes plots for gamma ($\gamma$) values equal to 10, 30, 50, 70, and 90, represented as plots 320B, 330B, 340B, 350B, and 360B, respectively. Each shows an initially constant value. Each also tracks with the idealized differentiator 310B for lower portions of the frequency range, before the phase value falls for increasing frequency values. For example, the phase of the $\gamma$=10 differentiator plot 320B starts to change just before 1 radian per second, while the $\gamma$=90 differentiator plot 360B begins to change at a point above 10 radians per second (between 20 and 30 rad/s). The plots between (i.e., the plots 330B, 340B, and 350B) have varying degrees of agreement with the idealized differentiator plot 310B across a greater range of frequencies in ascending order according to gamma value.

As shown by both the magnitude graph 300A and the phase graph 300B, idealized relationships are not possible for either magnitude or phase response of a differentiator across all frequencies. However, each graph reinforces the concept of increasingly ideal responses across a greater range of frequencies as the value of gamma increase. While this relationship holds true with respect to both parameters, the magnitude characteristics better mimic ideal conditions at lower values of gamma (i.e., the phase comparison breaks down at a lower frequency for the same gamma value). Thus, considerations of the phase characteristics are more germane when implementing an $n^{th}$-order differentiator according to embodiments of the present disclosure.

Figure 4:
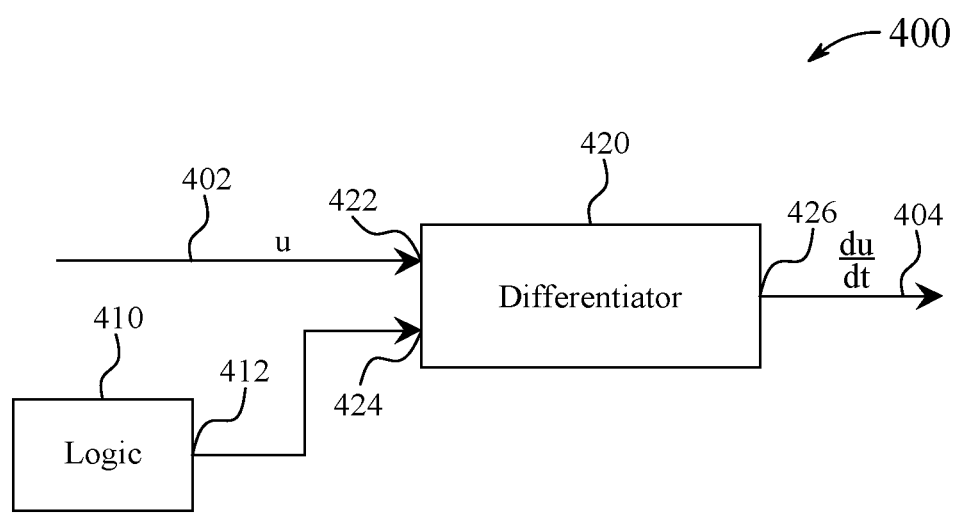
FIG. 4 is a simplified differentiator system, according to certain embodiments.

Another aspect related to the practicable differentiator is to vary the gain according to a signal that is independent from the state variables of the differentiator. As seen in FIG. 4, this can be implemented as a simplified differentiator system 400. The simplified system 400 has a system input 402, a system output 404, a logic block 410, and a differentiator 420. The differentiator 420 shown in FIG. 4 can be one identical or substantially similar to differentiators 100 or 200 described above and depicted in FIGS. 1 and 2.

The differentiator 420 has a first differentiator input 422, a second differentiator input 424, and a differentiator output 426. The first input 422 is received from the system input 402 and is substantially identical to the system input 402 in a lossless system. The second input 424 is received from the logic block 410, and specifically from a logic output 412 of logic block 410. The logic output 412 can be a signal proportional to gamma ($\gamma$). As such, the two inputs to the differentiator 420 are the signal u and the signal for the parameter $\gamma$. The resulting output of the differentiator, i.e., the differentiator output 426, is substantially a derivative of the input signal $$\left(\text{i.e., } \frac{du}{dt}\right).$$

The differentiator output 426 is also an equivalent to the system output 404.

Turning now to FIG. 5, a circuit diagram of a second-order variable-gain differentiator 500 (or simply "differentiator 500") is shown. The differentiator 500 includes a variable gain differentiator input 502 configured to generate an alternating current input signal, denoted as "u", which is supplied as the variable gain differentiator input. The differentiator 500 also includes a first voltage divider 506 connected to the voltage generator 502. In a non-limiting example, the voltage divider 506 may be implemented by a pair of 10 k$\Omega$ resistors.

The differentiator 500 includes a non-inverting operational amplifier 510. The non-inverting operational amplifier 510 includes a non-inverting operational amplifier input 512, an inverting operational amplifier input 514, and a non-inverting operational amplifier output 516. The non-inverting operational amplifier input 512 is connected to the first voltage divider 506. The inverting operational amplifier input 514 receives an output signal $x_1$ as described in further detail below. The non-inverting operational amplifier 510 receives inputs and performs operations in similar fashion as to those described above with respect to first adder 110 shown in FIG. 1. In a non-limiting example, the non-inverting operational amplifier 510 may be implemented using one or more conventional op-amps, such as an AD8628 (available from Analog Devices, Inc., of Wilmington, Mass.).

The non-inverting operational amplifier output 516 is connected in series with a first comparator block 520 by way of a first non-inverting comparator block input 522. The first comparator block 520 also includes a first comparator block output 526 and a first comparator power input 528. The first comparator block 520 performs an operation on the first non-inverting comparator block input 522, such as producing a gain (denoted by $\gamma$), for instance a gain of $\gamma^2$.

The first comparator block 520 includes a first comparator op amp U1 and a second comparator op amp U2. The first comparator op amp U1 can include a first non-inverting comparator block input 522-1, a first power supply input 528-1 connected to the first power input 528, and a first comparator output 526-1. The second comparator op amp U2 of the first comparator block 520 includes a second non-inverting input 522-2 connected in series with the first comparator output 526-1, a second power supply input 528-2 connected to the first power input 528, and a second comparator output 526-2. The second comparator output 526-2 is also the first comparator block output 526.

The differentiator 500 further includes a DC voltage-controlled, variable-gain amplifier 530 (also denoted as "$V_C$ 530"). As shown in FIG. 5, the DC voltage-controlled, variable-gain amplifier 530 is connected to the power input 528 of the first comparator block 520. The DC voltage-controlled, variable-gain amplifier 530 generates a gain, dependent on a parameter "$\gamma$", in conjunction with the first comparator block 520 (as well as with a second comparator block 570 described in further detail below). In certain embodiments, the gain of the first comparator block 520 is $\gamma^2$. In a non-limiting example, the DC voltage-controlled, variable-gain amplifier 530 may be implemented using a standard component voltage-controlled variable-gain amplifier, such as a VCA810ID (available from Texas Instruments Incorporated, of Dallas, Texas). In a non-limiting example, the DC voltage-controlled variable-gain amplifier ($V_C$) 530 may be configured to vary the gain ($\gamma$) between 40 dB and −40 dB as the bias voltage is varied from 0 volts to −2 volts.

Continuing with FIG. 5, a non-inverting difference amplifier block 540 is connected in series with the first comparator block output 526. The non-inverting difference amplifier block 540 includes a first non-inverting difference amplifier U4. The non-inverting difference amplifier block 540 includes a non-inverting difference amplifier block input 542, an inverting difference amplifier block input 544, and a non-inverting difference amplifier block output 546. The non-inverting difference amplifier block 540 functions as the second adder 130 as described above with respect to FIG. 1.

The differentiator 500 includes a second voltage divider 548 connected in series with the first comparator block output 526 and the non-inverting difference amplifier block input 542. The first non-inverting difference amplifier U4 is connected to the second voltage divider 548 and provides the non-inverting difference amplifier block output 546.

An integrator block 550 is connected in series with the non-inverting difference amplifier block output 546. Because the differentiator 500 is a second-order differentiator, there are two integrators 550-1 and 550-2 making up the integrator block 550. The integrator block 550 includes components that provide the function of the first integrator 150 and the second integrator 170 described with respect to FIG. 1 (and described in further detail below).

The integrator block 550 has an integrator block input 554, shown equivalently as a first integrator inverting input 554-1. The integrator block 550 also includes a plurality of integrator outputs, denoted as the first integrator output 556-1 and the second integrator output 556-2. The first integrator output 556-1 corresponds to the output $x_2$ as described above (in conjunction with FIG. 1) and below, while the second integrator output 556-2 corresponds to the above (in conjunction with FIG. 1) and below described output $x_1$.

The first integrator 550-1 includes a first integrator op amp U7 and the second integrator 550-2 includes a second integrator op amp U8. A first inverting input 552-1 of the first integrator 550-1 is connected to the non-inverting difference amplifier block output 546. The first integrator 550-1 includes a first integrator output 556-1, wherein the first integrator output 556-1 is connected by a first feedback path to the first inverting input 554-1 and connected to a first intermediate difference amplifier non-inverting input 562 of a first intermediate difference amplifier 560.

The second integrator 550-2 has a second inverting input 554-2 connected in series with the first integrator block output 556-1. The second integrator 550-2 also has a second integrator block output 556-2. The second integrator block output 556-2 is connected by a second feedback path to the second inverting input 554-2. Each of the first feedback path and the second feedback path includes a capacitor (C1) in parallel with a resistor (R2), the values of which can be selected based on the frequency range sought. As shown in FIG. 5, the second integrator block output 556-2 of the plurality of integrator block outputs 556 is connected to the inverting operational amplifier input 514 of the non-inverting operational amplifier 510.

The differentiator 500 also includes a first intermediate difference amplifier 560. The first intermediate difference amplifier 560 is connected in series with one integrator output of the plurality of integrator block outputs. As shown in FIG. 5, the first intermediate difference amplifier non-inverting input 562 is connected to the first integrator output 556-1. The first intermediate difference amplifier 560 also includes a first intermediate difference amplifier output 566.

The second-order differentiator 500 includes a second comparator block 570 having a second comparator block input 574, second comparator block output 576, and a second comparator block power supply input 578. The second comparator block input 572 is connected in series with the first intermediate difference amplifier output 566. The second comparator block output 576 is connected to the difference amplifier inverting input 544 of the difference amplifier block 540. The second comparator block power supply input 578 of the second comparator block 570 is connected to the DC voltage-controlled variable-gain amplifier 530.

As noted above, the DC voltage-controlled, variable-gain amplifier 530 generates a gain, dependent on a parameter "γ", in conjunction with the second comparator block 570. In certain embodiments, the gain of the second comparator block 570 is 2γ.

The DC voltage-controlled variable-gain amplifier 530 is configured to vary a gain of the first comparator block 520 and the second comparator block 570. Varying the gain of the first comparator block 520 and the second comparator block 570 varies an output gain of the differentiator 500. In a non-limiting example, the difference amplifier 560, the non-inverting amplifier 540 and the integrator block 550 may be implemented using one or more conventional op-amps, such as one or more AD8628 op amps.

The differentiator 500 further includes the variable gain differentiator output, denoted as output $x_1$, which is equivalent to the last integrator block output (i.e., second integrator output 556-2). The sensitivity of the variable gain differentiator output $x_1$ is configured to equal one-half the gain, γ, of the DC voltage-controlled variable-gain amplifier 530. In a non-limiting example, the first comparator block output 526 may be configured to have a gain equal to a square of the gain of the DC voltage-controlled variable-gain amplifier 530.

Using the above-mentioned conventional op-amps and circuit configurations, a ±10V powered system, and a 20-mV peak-to-peak input signal (i.e., for u), a 2 MHz frequency range is achievable. Other bandwidths can be achieved if various other components are selected as would be understood by one of skill in the relevant arts.

Figure 6:
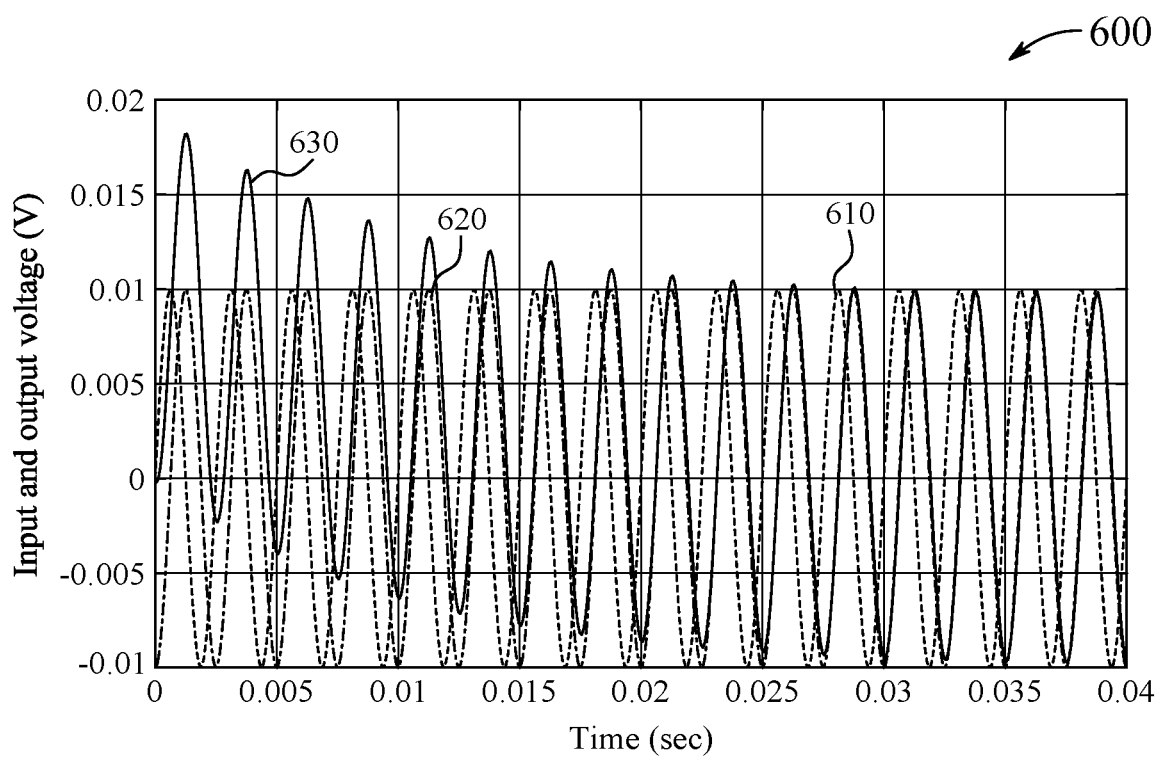
FIG. 6 is a numerical simulation of a second-order differentiator output, according to certain embodiments.

FIG. 6 is a numerical simulation 600 of the second-order differentiator output, according to certain embodiments. An electronic version of the differentiator 500 was simulated using commercially available devices in Multisim. Plots for the input u, the ideal derivative u̇, and the output $x_2$ for different values of the gain are shown by curves 610, 620, and 630, respectively. It is evident from the plot that as γ increases over time, the output signal 630 nearly identically mimics the ideal derivative signal 620 in terms of amplitude and phase shift. Within two one-hundredths of a second (i.e., t=0.02 seconds), curves 620 and 630 are nearly indistinguishable.

FIG. 7 is a circuit diagram of a third-order variable-gain differentiator 700 (or simply "differentiator 700"), according to certain embodiments. The differentiator 700 includes a variable gain differentiator input 702 configured to generate an alternating current input signal, denoted as "u", which is supplied as the variable gain differentiator input. The differentiator 700 also includes a first voltage divider 706 connected to the variable gain differentiator input 702. In a non-limiting example, the voltage divider 706 may be implemented by a pair of 10 kΩ resistors.

The differentiator 700 includes a non-inverting operational amplifier 710. The non-inverting operational amplifier 710 includes a non-inverting operational amplifier input 712, an inverting operational amplifier input 714, and a non-inverting operational amplifier output 716. The non-inverting operational amplifier input 712 is connected to the first voltage divider 706. The inverting operational amplifier input 714 receives a signal from an op amp denoted as U14 in FIG. 7 and described in further detail below. The non-inverting operational amplifier 710 receives inputs and performs operations in similar fashion as to those described above with respect to first adder 210 shown in FIG. 2. In a non-limiting example, the non-inverting operational amplifier 710 may be implemented using one or more conventional op-amps, such as one or more AD8628 op amps.

The non-inverting operational amplifier output 716 is connected in series with a first comparator block 720 by way of a first non-inverting comparator block input 722. The first comparator block 720 also includes a first comparator block output 726 and a first comparator block power input 728. The first comparator block 720 performs an operation on the first non-inverting comparator block input 722, such as producing a gain (denoted by $\gamma$), for instance a gain of $\gamma^3$.

The first comparator block 720 includes a first comparator U1, a second comparator U2, and a third comparator U6. The first comparator U1 includes the first non-inverting comparator block input 722 (which can be alternatively described as a first non-inverting comparator block input 722-1), a first power supply input 728-1 connected to the first comparator block power supply input 728, and a first comparator output 726-1. The second comparator U2 includes a second non-inverting input 722-2 connected in series with the first comparator output 726-1, a second power supply input 728-2 connected to the first comparator block power supply input 728, and a second comparator output 726-2. The third comparator U6 includes a third non-inverting input 722-3 connected in series with the second comparator output 726-2, a third power supply input 728-3 connected to the first comparator block power supply input 728, and a third comparator output 726-3 which is output as the first comparator block output 726.

The differentiator 700 further includes a DC voltage-controlled, variable-gain amplifier 730 (also denoted as "$V_C$ 730"). As shown in FIG. 7, the DC voltage-controlled, variable-gain amplifier 730 is connected to the first comparator block power input 728 of the first comparator block 720. The DC voltage-controlled, variable-gain amplifier 730 generates a gain, dependent on a parameter "$\gamma$", in conjunction with the first comparator block 720. The gain of the first comparator block 720 is $\gamma^3$. In a non-limiting example, the DC voltage-controlled, variable-gain amplifier 730 may be implemented using a standard component voltage-controlled variable-gain amplifier, such as a VCA810ID. In certain embodiments, the DC voltage-controlled variable-gain amplifier ($V_C$) 730 may be configured to vary the gain ($\gamma$) between 40 and −40 dB as the bias voltage is varied from 0 to −2 volts.

A non-inverting difference amplifier block 740 is also connected in series with the first comparator block output 726 as shown in FIG. 7. The non-inverting difference amplifier block 740 includes a non-inverting difference amplifier block input 742, an inverting difference amplifier block input 744, and a non-inverting difference amplifier block output 746. The non-inverting difference amplifier block 740 functions as the second adder 230 and the third adder 240 as described above with respect to FIG. 2. Thus, as shown in FIG. 7, non-inverting difference amplifier block 740 is depicted with a first non-inverting difference amplifier block op amp U4 equivalent to the second adder 230 and a second non-inverting difference amplifier block op amp U15 equivalent to the third adder 240 as described above with respect to FIG. 2.

The differentiator 700 also includes a second voltage divider 748-1. The second voltage divider 748-1 is connected in series with the first comparator block output 726.

The first non-inverting difference amplifier block op amp U4 is connected to the second voltage divider 748-1 at a first non-inverting difference amplifier input 742-1. The first non-inverting difference amplifier block op amp U4 includes a first non-inverting difference amplifier block op amp output 746-1.

The differentiator 700 further includes a third voltage divider 748-2 connected in series with the first non-inverting difference amplifier block op amp output 746-1. The second non-inverting difference amplifier block op amp U15 is connected to the third voltage divider 748-2 at a second non-inverting difference amplifier input 742-2. The second non-inverting difference amplifier block op amp U15 has a second non-inverting difference amplifier block op amp output 746-2, which is also the non-inverting difference amplifier block output 746.

The differentiator 700 includes an integrator block 750 connected in series with the non-inverting difference amplifier block output 746. The integrator block 750 has an integrator block input 752 and a plurality of integrator block outputs 756-1 through 756-3. The integrator block 750 includes components that provide the function of the first integrator 250, the second integrator 270 and the third integrator 290 described with respect to FIG. 2 (and described in further detail below).

The differentiator 700 also includes a first intermediate difference amplifier 760. The first intermediate difference amplifier 760 is connected in series with the second integrator block output 756-2 at a first intermediate difference amplifier input 762. The first intermediate difference amplifier 760 also includes a first intermediate difference amplifier output 766.

The third-order differentiator 700 includes a second comparator block 770 having a second comparator block non-inverting input 772, a second comparator block output 776, and a second comparator block power supply input 778. The second comparator block non-inverting input 772 is connected in series with the first intermediate difference amplifier output 766. The second comparator block output 776 is connected to inverting difference amplifier block input 744 of the non-inverting difference amplifier block 740. The second comparator block power supply input 778 of the second comparator block 770 is connected to the DC voltage-controlled variable-gain amplifier 730. Thus, second comparator block 770 mirrors the third comparator block 280 as described above. The DC voltage-controlled, variable-gain amplifier 730 generates a gain, parameterized by "$\gamma$" in conjunction with the second comparator block 770. The DC voltage-controlled, variable-gain amplifier 730 and the second comparator block 770 produce a gain of $3\gamma^2$.

As shown in FIG. 7, an integrator block output 756-3 of the plurality of integrator block outputs 756 is connected to the inverting operational amplifier input 714 of the non-inverting operational amplifier 710 through a connection with op-amp noted as U14.

The differentiator 700 includes a third comparator block 780, according to certain embodiments. The third comparator block 780 includes a third comparator non-inverting input 782 connected to a second intermediate difference amplifier, which is an op amp depicted in FIG. 7 as op amp U16. The third comparator block 780 includes a third comparator output 786, which is connected to a non-inverting difference amplifier inverting input of the op amp U15, denoted as an inverting input 744-2 of the non-inverting difference amplifier block 740. The third comparator block 780 includes a third comparator block power supply input 788. The third comparator block power supply input 788 of the third comparator block 780 is connected to the DC voltage-controlled variable-gain amplifier 730. Thus, the third comparator block 780 mirrors second comparator block 260 as described above. The DC voltage-controlled, variable-gain amplifier 730 generates a gain of $3\gamma$ in conjunction with the third comparator block 780.

The DC voltage-controlled variable-gain amplifier 730 is configured to vary a gain of the first comparator block 720, the second comparator block 770, and the third comparator block 780. Varying the gain of the first comparator block 720, the second comparator block 770, and the third comparator block 780 varies an output gain of the differentiator 700. In a non-limiting example, the difference amplifier 760, the non-inverting amplifier 710, and the integrator block 750 are implemented using one or more conventional op-amps, such as an AD8628.

The integrator block 750 includes a first integrator 750-1 connected at a first integrator inverting input 754-1 to the non-inverting difference amplifier block output 746. The first integrator 750-1 includes a first integrator op amp U7 and a third difference amplifier U11. The first integrator 750-1 includes the first integrator output 756-1, which corresponds to the signal $x_3$ as outline above in FIG. 2. The first integrator output 756-1 can be connected by a first feedback path to an inverting input of the third difference amplifier U11.

The differentiator 700 also includes a second intermediate difference amplifier U16. The second intermediate difference amplifier U16 includes a second intermediate difference amplifier non-inverting input connected to the first integrator output 756-1. The second intermediate difference amplifier U16 includes a second intermediate difference amplifier output connected to the non-inverting third comparator block input 782 of the third comparator block 780.

The integrator block 750 includes a second integrator 750-2 having a second integrator inverting input 754-2 connected in series with the first integrator output 756-1. The second integrator 750-2 includes a second integrator op amp U8 and a fourth difference amplifier U12. The second integrator 750-2 can include a second integrator output 756-2, which corresponds to the signal $x_2$ as outline above in FIG. 2. The second integrator output 756-2 can be connected by a second feedback path to an inverting input of the fourth difference amplifier U12. The second integrator output 756-2 can be connected to the first intermediate difference amplifier non-inverting input 762.

The integrator block 750 includes a third integrator 750-3, which further includes a third integrator inverting input 754-3 connected in series with the fourth difference amplifier U12 output, which is equivalently the second integrator output 756-2. The third integrator 770-3 can include the third integrator output 756-3, which is the last integrator block output. The third integrator output 756-3 corresponds to the output $x_1$ as outline above in FIG. 2. The last integrator block output 756-3 is connected by a third feedback path to the third integrator inverting input 754-3.

The differentiator 700 can further include a fifth difference amplifier, denoted as U14 in FIG. 7. The fifth difference amplifier U14 can include a fifth difference amplifier inverting input connected to the last integrator block output 756-3. The fifth difference amplifier U14 includes a fifth difference amplifier output connected to an inverting input 714 of the non-inverting operational amplifier 710.

Each of the first feedback path, the second feedback path and the third feedback path can include a capacitor (C1) in parallel with a resistor (R2), the values of which can be selected based on the frequency range sought.

In operation, the gain ($\gamma$) can be varied according to desired signal and frequency characteristics. For example, the first comparator block output 726 can be configured to have a gain equal to a cube of the gain of the DC voltage-controlled variable-gain amplifier 730. The feedback paths are configured to provide a feedback gain equal to three times the gain of the DC voltage-controlled variable-gain amplifier 730 to supply to an integrator. As another example, an additional feedback path can be configured to provide a second feedback gain equal to three times the square of the gain of the DC voltage-controlled variable-gain amplifier 730 to supply a different integrator. In yet another example, a feedback path within the system can be configured so that the sensitivity of the three comparator blocks and the DC voltage-controlled variable-gain amplifier 730 is equal to $$\frac{2\sqrt{3}}{9}$$

times the gain for a third-order system.

Using the above-mentioned op-amps and circuit configurations, a ±10V powered system, and a 20-mV peak-to-peak input signal (i.e., for u), a 2 MHz frequency range is achievable. Other bandwidths can be achieved if various other components are selected as would be understood by one of skill in the relevant arts.

Figure 8:
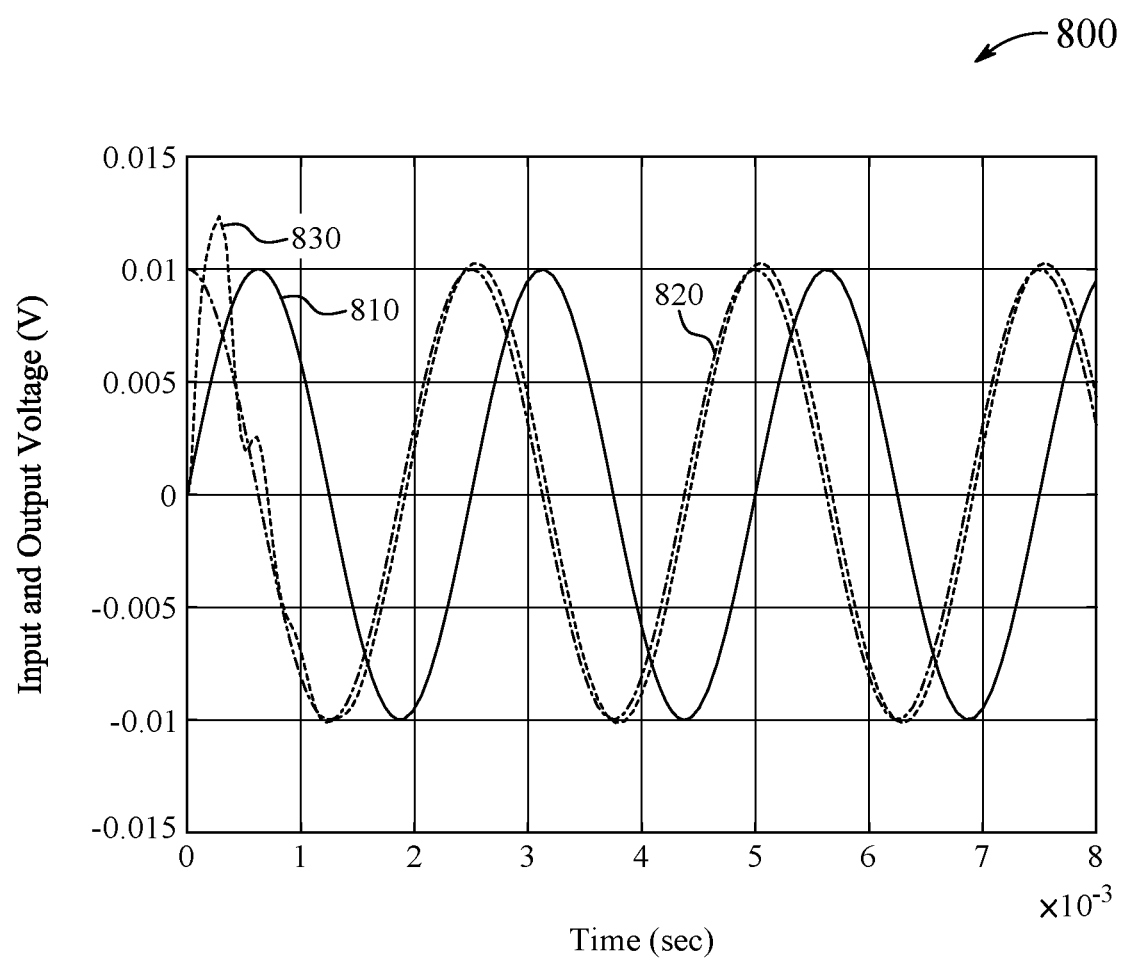
FIG. 8 is a numerical simulation of a third-order differentiator output, according to certain embodiments.

Returning to the analysis of the disclosed implementations, FIG. 8 is a numerical simulation 800 of a third-order differentiator output, according to certain embodiments. Again, an electronic version of differentiator 700 was simulated using Multisim. Plots for the input u, the ideal derivative $\dot{u}$, and the output $x_2$ for a gain value of two (i.e., $\gamma=2$) are shown by curves 810, 820, and 830, respectively. As shown in FIG. 8, over time the output signal 830 is nearly identically to the ideal derivative signal 820 in terms of amplitude and phase shift. Within one second (i.e., t=1 second), curves 820 and 830 are only minimally offset. However, the circuit of this embodiment requires signal conditioning to enable the amplifier to operate under normal conditions (i.e., conditions without saturation).

Figure 9:
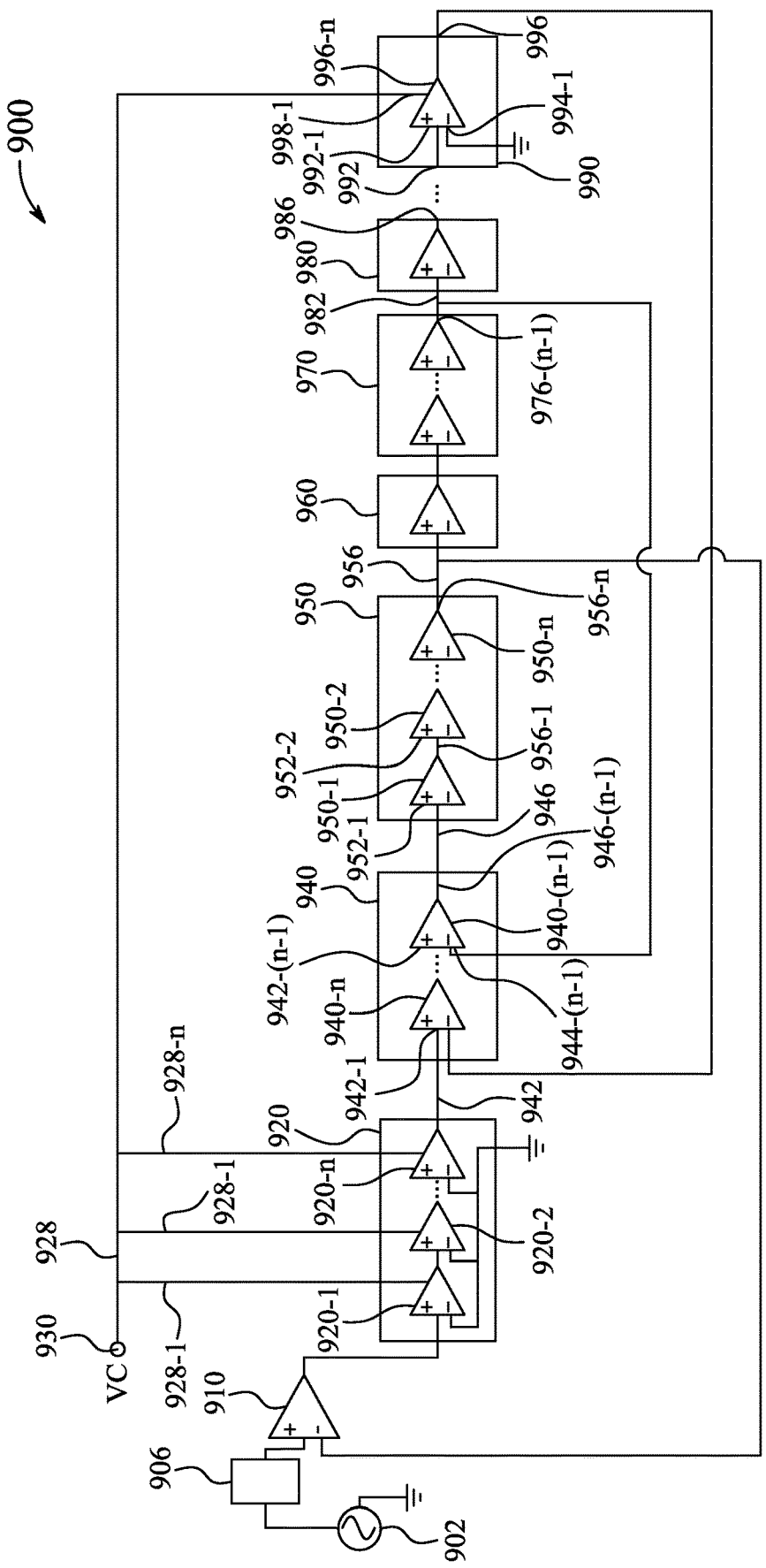
FIG. 9 is a diagram of an nth-order variable gain differentiator, according to certain embodiments.

As discussed above, the disclosed approach enables higher-order differentiators that are less sensitive to additive noise. FIG. 9 is a simplified block diagram of an $n^{th}$-order variable-gain differentiator 900 (or simply "differentiator 900"). The differentiator 900 includes a voltage generator 902 configured to generate an alternating current input signal, denoted as "u" and a first voltage divider 906 connected to the voltage generator. The differentiator 900 also includes a non-inverting operational amplifier 910. The non-inverting operational amplifier 910 has a non-inverting operational amplifier input 912 connected to the first voltage divider 906. The non-inverting operational amplifier 910 also has a non-inverting operational amplifier output 916. A first non-inverting comparator input 922-1 is connected in series with the non-inverting operational amplifier output 916.

The differentiator 900 further includes a first comparator block 920, which includes n comparators. In some embodiments, n is selected from the range of 1 to 20. The comparators in the first comparator block 920, denoted as comparators 920-1, 920-2, . . . , 920-n, are connected in series. As the first input in the first comparator block 920, the first non-inverting comparator input 922-1 can also be referred to a first comparator block input 922. A first comparator block output 926 is also an output of the $n^{th}$ comparator 920-n, denoted as 926-n. Each comparator 920-1 through 920-n has a respective input 922-1 through 922-n and a respective output 926-1 through 926-n, wherein an output of each comparator is connected to the input of the subsequent comparator as shown in FIG. 9.

The differentiator 900 also includes a DC voltage-controlled variable-gain amplifier ($V_C$) 930 (also referred to as "$V_C$ 930"). The $V_C$ 930 is connected to a power input 928 of each of the n comparators of the first comparator block 920. The DC voltage-controlled variable-gain amplifier 930 generates a gain, parameterized by γ.

The DC voltage-controlled variable-gain amplifier 930 in conjunction with the first comparator block 920 generates a gain $γ^n$ at the first comparator block output 926. The output, y, can be a derivative of the alternating current input signal, u. A transfer function of the $n^{th}$-order variable-gain differentiator can be given by Equation 14 above.

The differentiator 900 includes a non-inverting difference amplifier block 940, which in turn includes a total of n−1 non-inverting difference amplifiers. The non-inverting difference amplifier block 940 has a non-inverting difference amplifier block input 942 connected in series with the first comparator block output 926. The non-inverting difference amplifier block 940 can have a non-inverting difference amplifier block output 946 at the final (i.e., at the $(n-1)^{th}$) non-inverting difference amplifier. The n−1 difference amplifiers of the non-inverting difference amplifier block 940 are shown as non-inverting difference amplifiers 940-1 through 940-(n−1). Each of difference amplifiers 940-1 through 940-(n−1) has a respective input 942-1 through 942-(n−1) and a respective output 946-1 through 946-(n−1), wherein an output of each difference amplifier is connected to the input of the subsequent difference amplifier as shown in FIG. 9.

The differentiator 900 also includes an integrator block 950 connected in series with the non-inverting difference amplifier block output 946. In some embodiments, the integrator block 950 includes n integrators connected in series. The integrator block 950 can have n integrator block inputs 952-1 through 952-n and n integrator block outputs 956-1 through 956-n.

A first intermediate difference amplifier 960 is connected in series with one of the n integrator block outputs 956 (i.e., one of integrator outputs 956-1 through 956-n). The first intermediate difference amplifier 960 has a first intermediate difference amplifier input 962 and a first intermediate difference amplifier output 966.

Continuing with FIG. 9, a second comparator block 970 is connected in series with the first intermediate difference amplifier output 966. The second comparator block 970 has a second comparator block output 976 connected to the inverting input of the difference amplifier block 940. The second comparator block 970 includes n−1 comparators denoted as second comparator 970-1 through 970-(n−1). Second power supply inputs 978-1 through 978-(n−1) are connected to the DC voltage-controlled variable-gain amplifier 930.

A second intermediate difference amplifier 980 is connected in series with one of the n integrator block outputs 956 (i.e., one of integrator outputs 956-1 through 956-n). The second intermediate difference amplifier 980 has a second intermediate difference amplifier input 982 and a second intermediate difference amplifier output 986. Depending on the order of the differentiator, the second intermediate difference amplifier output 986 can be connected in series to a third comparator block, not shown in the attached figure as one of several omitted comparator blocks. For a value of n=3, the second intermediate difference amplifier output 986 can be connected in series to an $n^{th}$ comparator block described below (i.e., for n=3 the $n^{th}$ comparator block is a third comparator block).

Continuing with FIG. 9, an $n^{th}$ comparator block 990 is connected in series with an output of an $(n-1)^{th}$ intermediate difference amplifier output. As noted above for a value of n=3, the $n^{th}$ comparator block 990 is connected in series with the second intermediate difference amplifier output 986. For higher order systems, there will be additional components between and the $n^{th}$ comparator block 990 is connected to a different intermediate difference amplifier output (i.e., third, fourth, fifth, etc.).

The $n^{th}$ comparator block 990 has a $n^{th}$ comparator block output 996 connected to an inverting input 944-(n−1) of difference amplifier 940-(n−1) in the difference amplifier block 940. An $n^{th}$ power supply input 998 of the second comparator block 990 is connected to the DC voltage-controlled variable gain amplifier 930. As it is the final comparator block in differentiator 900, the $n^{th}$ comparator block 990 includes only a single comparator/op amp.

The differentiator 900 further includes an $n^{th}$ integrator block output 956-n of the plurality of integrator block outputs 956 connected to an inverting input 944 of the non-inverting operational amplifier, wherein the $n^{th}$ integrator block output is the output, y, of the $n^{th}$-order variable gain differentiator 900. The DC voltage-controlled variable-gain amplifier 930 is further configured to vary a gain of the second comparator block 970. Varying the gain of the first comparator block 920 and the second comparator block 970 varies an output gain of the $n^{th}$-order variable-gain differentiator 900.

Figure 10:
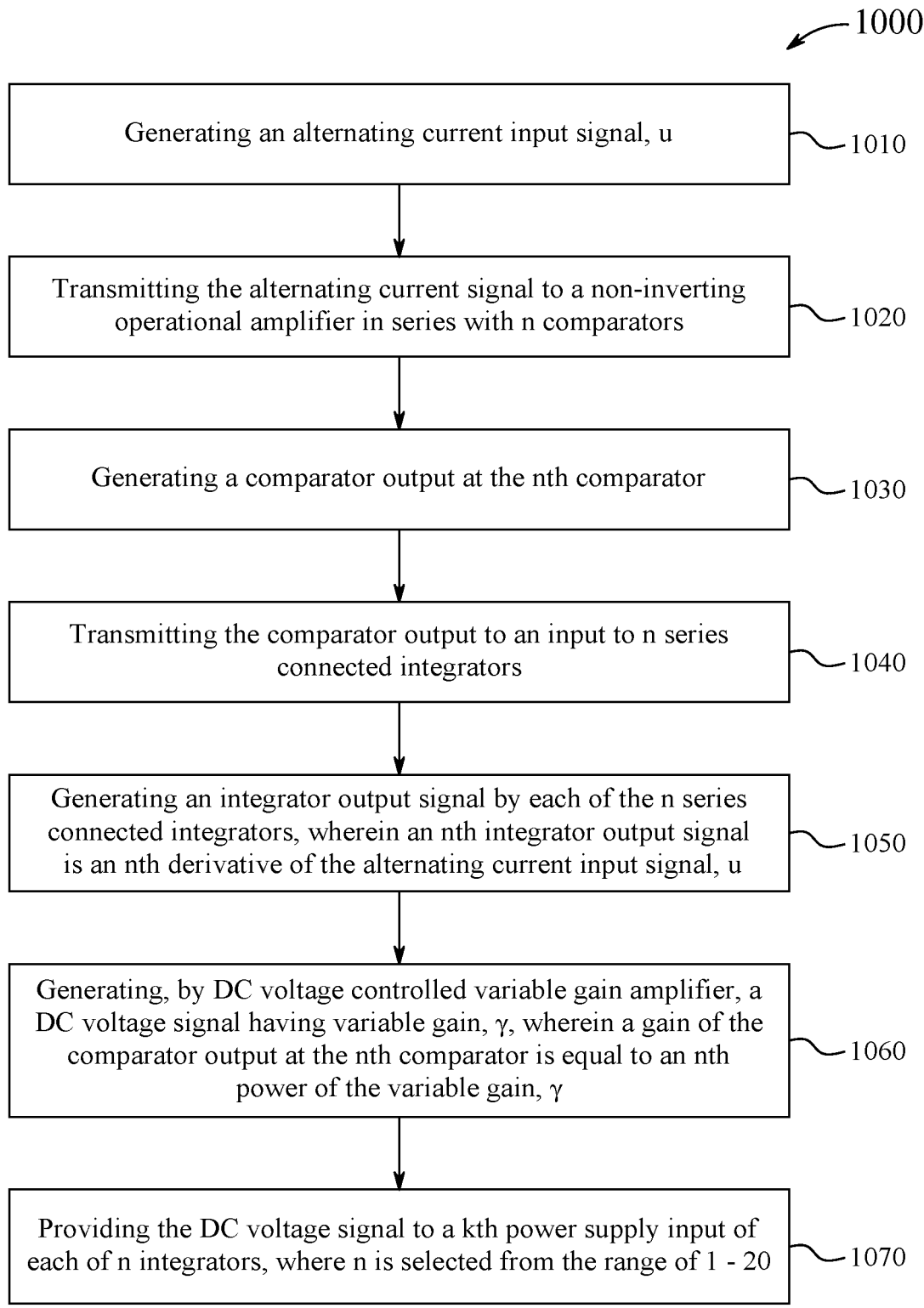
FIG. 10 is a flowchart representing a method for nth-order variable gain differentiation, according to certain embodiments.

FIG. 10 is a flowchart representing a method 1000 for $n^{th}$-order, variable-gain differentiation, according to certain embodiments. The method 1000 can use an $n^{th}$-order variable-gain differentiator, such as the $n^{th}$-order variable-gain differentiator 900 described above with respect to FIG. 9. One of skill in the relevant art would also understand that the generically described method 1000 could also be carried out for specific integer values of n by the second-order differentiator 500 or the third-order differentiator 700 described above with respect to FIGS. 5 and 7, respectively.

The method 1000 includes generating an alternating current input signal, u, at a step 1010. In some embodiments, this could be a signal from a voltage generator, such as the voltage generator 510, the voltage generator 710, or the voltage generator 910 disclosed in the descriptions above. At a step 1020, the alternating current input signal is transmitted to a non-inverting operational amplifier in series with n comparators. For example, the alternating current input signal can be transmitted to the non-inverting difference amplifier block input 560 or 760 as shown in FIG. 5 or 7. In certain embodiments, n is selected from the range of 1 to 20.

At a step 1030, a comparator output is generated at the $n^{th}$ comparator. In an embodiment as described above with respect to FIG. 9, this can be at the comparator 930-n. As described corresponding to FIG. 5, the $n^{th}$ comparator can be comparator 530-2, while as shown in FIG. 7 this element is comparator 730-3.

At a step 1040, the comparator output is transmitted to an input of n series-connected integrators. As seen in FIG. 5, this can be the first and second integrator inputs 572 and 574. At a step 1050, an integrator output signal (e.g., integrator output signal 576 described above) is generated by each of the n series connected integrators. An $n^{th}$ integrator output signal is an $n^{th}$ derivative of the alternating current input signal (u).

At a step 1060, the DC voltage-controlled variable-gain amplifier generates a DC voltage signal having variable gain ($\gamma$). A gain of the comparator output at the $n^{th}$ comparator is equal to an $n^{th}$ power of the variable gain, $\gamma$. As described with the differentiators 500, 700, and 900, the resulting gain of the $n^{th}$ comparator output is $\gamma^2$, $\gamma^3$, and $\gamma^n$, respectively. At a step 1070, the DC voltage signal is provided to a $k^{th}$ power supply input of each of n integrators.

The above descriptions realize analog circuits providing an estimate of a first derivative of a given signal. A voltage-controlled amplifier is used to modify the circuit's behavior and to tune the gain of the amplifier. The tuning capabilities enable increased precision for the differentiator, as well as prevent additive noise from corrupting signal outputs. The disclosed systems, devices and methods using a series with at least two non-inverting amplifiers for a variable-gain differentiator, although this number can vary and, in some embodiments, ranges anywhere from two to 20. The number of non-inverting amplifiers determines the order of the variable-gain differentiator, denoted as n (or as an $n^{th}$-order differentiator).

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A variable gain differentiator, comprising:
   a voltage generator configured to generate an alternating current input signal, u;
   a first voltage divider connected to the voltage generator;
   a non-inverting operational amplifier having a non-inverting operational amplifier input connected to the first voltage divider, and having a non-inverting operational amplifier output;
   a first comparator block having a first non-inverting comparator block input connected in series with the non-inverting operational amplifier output, the first comparator block having a first comparator block output;
   a DC voltage controlled variable gain amplifier, $V_c$, connected to a power input of the first comparator block, the DC voltage controlled variable gain amplifier generating a gain, $\gamma$;
   a non-inverting difference amplifier block having a non-inverting difference amplifier block input connected in series with the first comparator block output, the non-inverting difference amplifier block having a non-inverting difference amplifier block output;
   an integrator block connected in series with the non-inverting difference amplifier block output, the integrator block having a plurality of integrator block outputs;
   a first intermediate difference amplifier connected in series with one of the plurality of integrator block outputs, the first intermediate difference amplifier having a first intermediate difference amplifier output;
   a second comparator block connected in series with the first intermediate difference amplifier output, the second comparator block having a second comparator block output connected to the inverting input of the difference amplifier block, a second power supply input of the second comparator block connected to the DC voltage controlled variable gain amplifier;
   a last integrator block output of the plurality of integrator block outputs connected to an inverting input of the non-inverting operational amplifier; and
   wherein the DC voltage controlled variable gain amplifier, $V_c$, is configured to vary a gain of the first comparator block and the second comparator block, wherein varying the gain of the first comparator block and the second comparator block varies an output gain of the variable gain differentiator.

2. The variable gain differentiator of claim 1, wherein the DC voltage controlled variable gain amplifier (Vc) is configured to vary the gain, $\gamma$, from 0 to −2 volts.

3. The variable gain differentiator of claim 1, further comprising:
   a first comparator located in the first comparator block (U1, U2), the first comparator including the first non-inverting comparator block input, a first power supply input connected to the first power input, and a first comparator output; and
   a second comparator located in the first comparator block and having a second non-inverting input connected in series with the first comparator output, a second power supply input connected to the first power input, and a second comparator output located at the first comparator block output.

4. The variable gain differentiator of claim 3, further comprising:
   a second voltage divider connected in series with the first comparator block output and the non-inverting difference amplifier block (U4, U15) input; and
   a first non-inverting difference amplifier (U4) located in the non-inverting difference amplifier block, the first non-inverting difference amplifier connected at a first non-inverting difference amplifier input to the second voltage divider and connected at a first non-inverting difference amplifier output to the non-inverting difference amplifier block output.

5. The variable gain differentiator of claim 4, further comprising:
   a first integrator located in the integrator block, a first inverting input of the first integrator connected to the non-inverting difference amplifier block output, the first integrator having the first integrator block output, wherein the first integrator block output is connected by a first feedback path to the first inverting input and connected to a first intermediate difference amplifier non-inverting input of the first intermediate difference amplifier; and
   a second integrator located in the integrator block, a second inverting input of the second integrator connected in series with the first integrator block output, the second integrator having the last integrator block output, wherein the last integrator block output is connected by a second feedback path to the second inverting input.

6. The variable gain differentiator of claim 5, further comprising:
   a variable gain differentiator output connected to the last integrator block output, wherein the variable gain differentiator output is the derivative of the first integrator output, and the variable gain differentiator output gain is configured to equal one-half the gain, $\gamma$, of the DC voltage controlled variable gain amplifier.

7. The variable gain differentiator of claim 6, wherein the first comparator block output is configured to have a gain equal to a square of the gain of the DC voltage controlled variable gain amplifier.

8. The variable gain differentiator of claim 7, wherein each of the first feedback path and the second feedback path include a capacitor in parallel with a resistor.

9. The variable gain differentiator of claim 1, further comprising:
a first comparator located in the first comparator block, the first comparator including the first non-inverting comparator block input, a first power supply input connected to the first power input, and a first comparator output;
a second comparator located in the first comparator block and having a second non-inverting input connected in series with the first comparator output, a second power supply input connected to the first power input, and a second comparator output; and
a third comparator located in the first comparator block and having a third non-inverting input connected in series with the second comparator output, a third power supply input connected to the first power input, and a third comparator output located at the last comparator block output.

10. The variable gain differentiator of claim 9, further comprising:
a second voltage divider connected in series with the first comparator block output;
a first non-inverting difference amplifier located in the non-inverting difference amplifier block, the first non-inverting difference amplifier connected at a first non-inverting difference amplifier input to the second voltage divider, the first non-inverting difference amplifier having a first non-inverting difference amplifier output;
a third voltage divider connected in series with the first non-inverting difference amplifier output; and
a second non-inverting difference amplifier located in the non-inverting difference amplifier block, the second non-inverting difference amplifier connected at a second non-inverting difference amplifier input to the third voltage divider, the second non-inverting difference amplifier having a second non-inverting difference amplifier output connected to the non-inverting difference amplifier block output and to a second inverting difference amplifier input.

11. The variable gain differentiator of claim 10, wherein the integrator block comprises:
a first integrator connected at a first integrator inverting input to the non-inverting difference amplifier block output, the first integrator having the first integrator block output, wherein the first integrator block output is connected by a first feedback path to the first integrator inverting input;
a third difference amplifier having a third difference amplifier inverting input connected to the first integrator block output, the third difference amplifier having a third difference amplifier output;
a second intermediate difference amplifier having a second intermediate difference amplifier non-inverting input connected to the third difference amplifier output, the second intermediate difference amplifier having a second intermediate difference amplifier output;
a fourth comparator having a fourth comparator non-inverting input connected to the second intermediate difference amplifier output, the fourth comparator having a fourth comparator output, wherein the fourth comparator output is connected to a second non-inverting difference amplifier inverting input;
a second integrator having a second integrator inverting input connected in series with the third difference amplifier output, the second integrator having a second integrator block output of the plurality of integrator block outputs, wherein the second integrator block output is connected by a second feedback path to the second integrator inverting input;
a fourth difference amplifier having a fourth difference amplifier inverting input connected to the second integrator block output, the fourth difference amplifier having a fourth difference amplifier output, wherein the fourth difference amplifier output is connected to a first intermediate difference amplifier non-inverting input;
a third integrator having a third integrator inverting input connected in series with the fourth difference amplifier output, the third integrator having the last integrator block output, wherein the last integrator block output is connected by a third feedback path to the third integrator inverting input; and
a fifth difference amplifier having a fifth difference amplifier inverting input connected to the last integrator block output, the fifth difference amplifier having a fifth difference amplifier output, wherein the fifth difference amplifier output is connected to a non-inverting operational amplifier inverting input of the non-inverting operational amplifier.

12. The variable gain differentiator of claim 11, wherein each of the first feedback path, the second feedback path and the third feedback path include a capacitor in parallel with a resistor.

13. The variable gain differentiator of claim 12, wherein the first comparator block output is configured to have a gain equal to a cube of the gain of the DC voltage controlled variable gain amplifier.

14. The variable gain differentiator of claim 12, wherein the first feedback path is configured to provide a first feedback gain equal to three times the gain of the DC voltage controlled variable gain amplifier to the first integrator inverting input.

15. The variable gain differentiator of claim 12, wherein the second feedback path is configured to provide a second feedback gain equal to three times the square of the gain of the DC voltage controlled variable gain amplifier to the second integrator inverting input.

16. The variable gain differentiator of claim 12, wherein the third feedback path is configured to provide a third feedback gain equal to $$\frac{2\sqrt{3}}{9}$$

times the gain of the DC voltage controlled variable gain amplifier to the third integrator inverting input.

17. The variable gain differentiator of claim 12, wherein:
the third integrator output, $x_1$, is a third derivative of the first integrator output;
the second integrator output, $x_2$, is a second derivative of the first integrator output which equals the variable gain differentiator output, y; and
a first derivative, $\dot{x}_3$, of the first integrator output, $x_3$, is given by:

$$\dot{x}_3 = -\gamma^3(x_1-u)-3\gamma^2 x_2-3\gamma x_3.$$

18. An $n^{th}$ order variable gain differentiator, comprising:
a voltage generator configured to generate an alternating current input signal, u;
a first voltage divider connected to the voltage generator;

a non-inverting operational amplifier having a non-inverting operational amplifier input connected to the first voltage divider, and having a non-inverting operational amplifier output;

a first comparator block including n comparators connected in series, wherein n is selected from the range of 1 to 20, wherein a first non-inverting comparator input is connected in series with the non-inverting operational amplifier output, and a first comparator block output is an output of the $n^{th}$ comparator;

a DC voltage controlled variable gain amplifier ($V_c$) connected to a power input each of the n comparators of the first comparator block, the DC voltage controlled variable gain amplifier generating a gain, $\gamma$;

a non-inverting difference amplifier block including n−1 non-inverting difference amplifiers, the non-inverting difference amplifier block having a non-inverting difference amplifier block input connected in series with the first comparator block output, the non-inverting difference amplifier block having a non-inverting difference amplifier block output at the $(n-1)^{th}$ non-inverting difference amplifier;

an integrator block connected in series with the non-inverting difference amplifier block output, the integrator block having n integrator block outputs;

a first intermediate difference amplifier connected in series with one of the n integrator block outputs, the first intermediate difference amplifier having a first intermediate difference amplifier output;

a second comparator block connected in series with the first intermediate difference amplifier output, the second comparator block having a second comparator block output connected to the inverting input of the difference amplifier block, a second power supply input of the second comparator block connected to the DC voltage controlled variable gain amplifier;

an $n^{th}$ integrator block output of the plurality of integrator block outputs connected to an inverting input of the non-inverting operational amplifier, wherein the $n^{th}$ integrator block output is the output, y, of the $n^{th}$ order variable gain differentiator; and wherein the DC voltage controlled variable gain amplifier is configured to vary a gain of the first comparator block and the second comparator block, wherein varying the gain of the first comparator block and the second comparator block varies an output gain of the $n^{th}$ order variable gain differentiator.

19. The $n^{th}$ order variable gain differentiator of claim 18, wherein:

the first comparator block output is configured to have a gain equal to an $n^{th}$ power of the gain of the DC voltage controlled variable gain amplifier;

the output, y, is an $n^{th}$ derivative of the alternating current input signal, u;

a transfer function of the $n^{th}$ order variable gain differentiator is given by:

$$G(s) = \frac{s}{1 + \sum_{k=1}^{n} C_n^k \frac{s^k}{\gamma^k}},$$

where s is a complex number frequency parameter of a LaPlace transform of the input signal, u, and C is a vector of the form:

$C = (0\ 1\ 0\ \ldots\ 0)$.

20. A method for $n^{th}$ order variable gain differentiation, comprising:

generating an alternating current input signal, u;

transmitting the alternating current signal to a non-inverting operational amplifier in series with n comparators, and generating a comparator output at the $n^{th}$ comparator;

transmitting the comparator output to an input to n series connected integrators;

generating an integrator output signal by each of the n series connected integrators;

generating, by DC voltage controlled variable gain amplifier, a DC voltage signal having variable gain, $\gamma$;

providing the DC voltage signal to an $k^{th}$ power supply input of each of n integrators, where n is selected from the range of 1-20;

wherein an $n^{th}$ integrator output signal is an $n^{th}$ derivative of the alternating current input signal, u;

wherein a gain of the comparator output at the $n^{th}$ comparator is equal to an $n^{th}$ power of the variable gain, $\gamma$.

* * * * *